(12) United States Patent
Nadaoka

(10) Patent No.: US 6,199,183 B1
(45) Date of Patent: Mar. 6, 2001

(54) METHOD OF FORMING A SCAN PATH NETWORK

(75) Inventor: Mitsuru Nadaoka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/090,170

(22) Filed: Jun. 4, 1998

(30) Foreign Application Priority Data

Jun. 5, 1997 (JP) ................................................... 9-147974

(51) Int. Cl.[7] ..................................................... G01R 31/28
(52) U.S. Cl. ............................. 714/726; 714/727; 714/729
(58) Field of Search ................................... 714/726, 727, 714/729, 731, 744; 324/158.1, 73.1

(56) References Cited

U.S. PATENT DOCUMENTS

| 5,627,841 | * | 5/1997 | Nakamura | 714/726 |
| 5,680,406 | * | 10/1997 | Nakamura | 714/724 |
| 5,815,655 | * | 9/1998 | Koshiyama | 714/45 |
| 5,928,374 | * | 7/1999 | Shimizu et al. | 714/724 |

* cited by examiner

*Primary Examiner*—Hoa T. Nguyen
(74) *Attorney, Agent, or Firm*—Venable; Robert J. Frank

(57) ABSTRACT

In a method of forming a scan path network, typical of the present invention, at a semiconductor integrated circuit having a clock node supplying a clock signal, a scan-in node supplying scan data and a scan-out node for receiving scan data outputted from scan flip-flops, the following steps are carried out. A plurality of scan flip-flops are placed. Delay times taken for the clock signal supplied to the clock node to reach the scan flip-flops are calculated. Distances between the scan flip-flops are calculated. Skews between the scan flip-flops are calculated. A sum of the calculated distances and the skews is calculated. The smallest value from within this total is then decided upon. The scan flip-flops are then connected across the scan-in node and the scan-out node based on this smallest value.

22 Claims, 9 Drawing Sheets

METHOD OF FORMING A SCAN PATH NETWORK

BACKGROUND OF THE INVENTION

The present invention relates to a method of forming a scan path network and a semiconductor integrated circuit having a scan path network. Scan path networks are a technique for effectively carrying out testing of the operation of semiconductor integrated circuits. This technique is described, for example, in the following technical paper.

"A method of length minimization and short path error correction for scan path", Proceedings of the 52nd national convention of information processing society of Japan, No. 6, P27–28, 1996, Nakamura, Kobayashi, et al, "scan path line length optimization and hold time compensation techniques", P.27–28.

In order to increase the degree of integration of a circuit, it is preferable to make a scan path (the length of the path (wiring) from a scan-in pad to a scan-out pad) short. However, if the scan path is simply made short, there is the possibility that hold time errors will occur. Therefore, in the above technical paper, after connection (the connecting of each circuit using wiring) is complete, a step is executed where hold time error verification is carried out and buffers are then inserted at prescribed places (places where hold time errors occur) on the scan path.

However, with the kind of method in this technical paper, timing verification of each circuit has to be carried out again, thereby lengthening the design period of a semiconductor integrated circuit. A scan path network forming method that shortens the design period is therefore desired.

SUMMARY OF THE INVENTION

The present invention is therefore a method of forming a scan path network for resolving the aforementioned problems. In a typical method of forming a scan path network at a semiconductor integrated circuit having a clock node supplying a clock signal, a scan-in node supplying scan data and a scan-out node for receiving scan data outputted from scan flip-flops, the following steps are carried out. A plurality of scan flip-flops are placed. Delay times taken for the clock signal supplied to the clock node to reach the scan flip-flops are calculated. Distances between the scan flip-flops are calculated. Skews between the scan flip-flops are calculated. A sum of the calculated distances and the skews is calculated. The smallest value from within this total is then decided upon. The scan flip-flops are then connected across the scan-in node and the scan-out node based on this smallest value.

DETAILED DESCRIPTION OF THE PREFERRED EMBODIMENTS

First Embodiment

Figure 1:
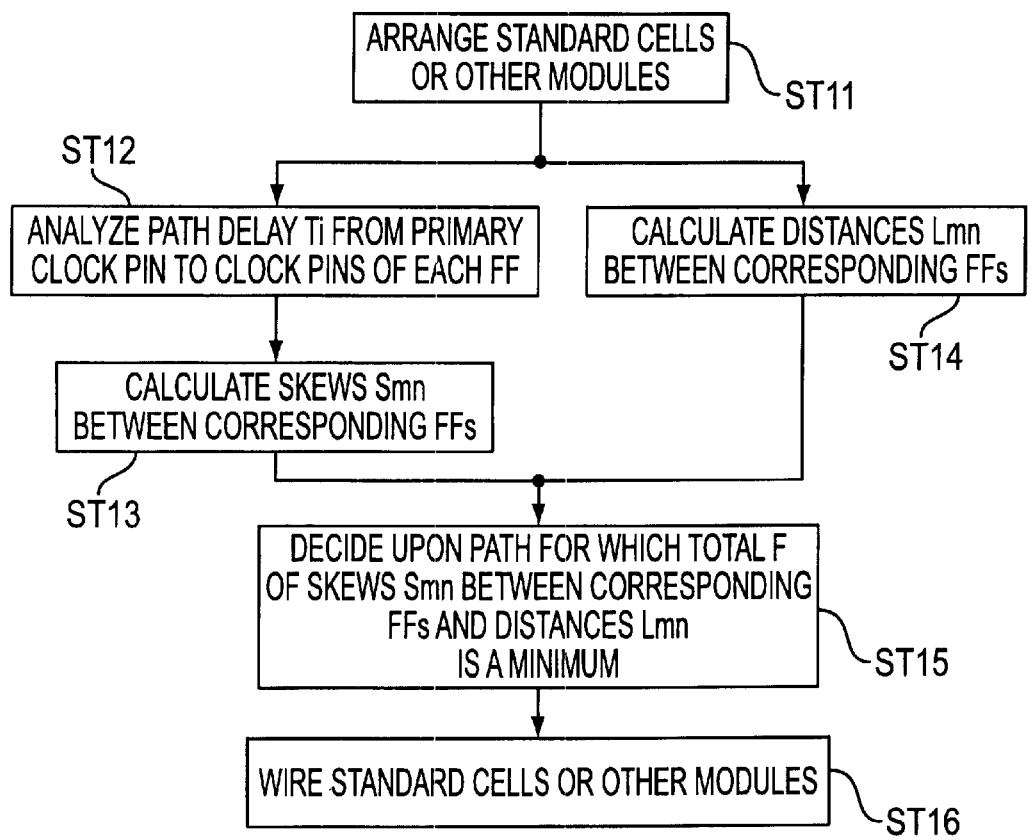
FIG. 1 is a flowchart showing a first embodiment of the present invention.
Figure 2:
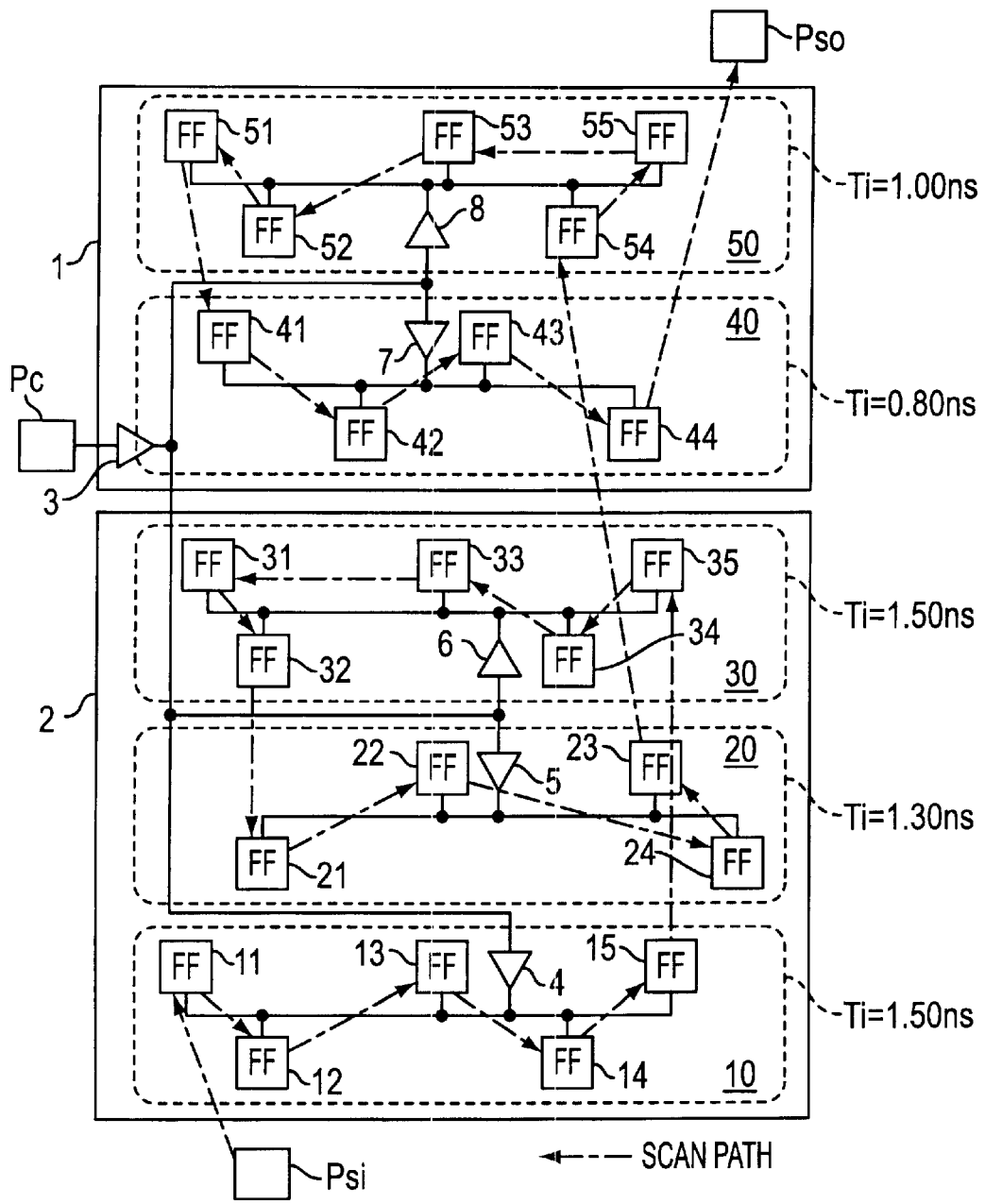
FIG. 2 is a view showing a scan path network to which the first embodiment of the present invention is applied.

FIG. 1 is a flowchart showing a first embodiment of the present invention. FIG. 2 is an example of a scan path network formed using the first embodiment.

In this first embodiment, step ST11 to step ST16 shown in FIG. 1 are executed. By executing these steps ST11 to ST16, "flip-flops" (hereinafter abbreviated to "FF's") within a Large Scale Integration (hereinafter abbreviated to "LSI") are connected in series so that a scan path network is formed.

The following is a description of step ST11 to step ST16.

Step ST11 is a layout process where standard cells or other modules are placed based on LSI circuit information. For example, in step ST11, standard cells or other modules are placed within the integrated circuit. As a result of this process two physical blocks 1 and 2 are placed as shown in FIG. 2. A clock CK supplied to a clock pad PC is then provided via a clock buffer 3 to FF1 to FF15 constituting circuits and scan path networks (not shown) within each of the physical layers 1 and 2.

Clock buffers 4, 5 and 6 for receiving outputs of the clock buffer 3 are placed at the physical block 1, with clock buffers 7 and 8 for receiving the output of the clock buffer 3 being placed at the physical block 2. FF11 to FF15 are placed at clock buffer 4, with the output of clock buffer 4 being supplied to clock terminals of FF11 to FF15. FF21 to FF24 are placed at clock buffer 5 with the output of clock buffer 5 being supplied to clock terminals of FF21 to FF24. FF31 to FF35 are placed at the clock buffer 6, with the output of the clock buffer 6 being supplied to clock terminals of FF31 to FF35.

Clock buffers 7 and 8 for receiving the output of the clock buffer 3 are placed at the physical block 2. FF41 to FF44 are placed at clock buffer 7, with the output of clock buffer 7 being supplied to clock terminals of FF41 to FF44. FF51 to FF55 are placed at clock buffer 8, with the output of clock buffer 8 being supplied to clock terminals of FF51 to FF55.

Continuing on from step ST11, the following process is carried out in step ST12.

Step ST12 is a clock delay calculation process where the times (clock path delay times Ti) the clock CK supplied to the clock pad Pc takes to reach each of FF11 to FF55 are calculated. A clock path delay Ti of 1.50 ns is calculated for a group 10 comprised of FF11 to FF15 corresponding to clock buffer 4. A clock path delay Ti of 1.30 ns is calculated for a group 20 comprised of FF21 to FF24 corresponding to the clock buffer 5. A clock path delay Ti of 1.50 ns is calculated for a group 30 comprised of FF31 to FF35 corresponding to clock buffer 6. A clock path delay Ti of 0.80 ns is calculated for a group 40 comprised of FF41 to FF44 corresponding to clock buffer 7 and a clock path delay Ti of 1.00 ns is calculated for a group 50 comprised of FF51 to FF55 corresponding to clock buffer 8.

Following of from step ST12, the following process is carried out in step ST13.

Step ST13 is a skew estimating process, where the following equation (1) is applied to all of FF11 to FF55 based on each of the delay times Ti obtained in step ST12.

Namely, clock skews Smn are calculated for FF11 to FF55, respectively.

$$Smn = Tn - Tm \quad (1)$$

Tn; delay time Ti for a target flip-flop FFn out of FF11 to FF55.

Tm; delay time Ti for a flip-flop FFm other than FFn in FF11 to FF55.

On the other hand, the following is carried out in step ST14 in parallel with step ST12 and ST13. Step ST14 is a distance calculating process, with a distance Lmn between an arbitrary two FFs out of FF11 to FF55 being calculated using the following equation (2).

$$Lmn = |Xm - Xn| + |Ym - Yn| \quad (2)$$

Xm; X-coordinate of center of FFm
Xn; X-coordinate of center of FFn
Ym; Y-coordinate of center of FFm
Yn; Y-coordinate of center of FFn Continuing on from step ST13 and step ST14, step ST15 is a path selection process.

This path selection process selects a path (scan path) from a scan-in pad Psi to a scan-out pad Pso in such a manner that a sum total F of cross skew Smn and distance Lmn between FFs becomes a minimum. This selection process carries out calculations using the following equation (3).

$$F = \sum_{mn} (K1 * Lmn ** K2 + K3 * Smn ** K4) \quad (3)$$

K1 to K4: constants for user designations

The scan-in pad Psi is a test data input terminal and the scan-out pad Pso is an output terminal. A connection sequence for FF11 to FF55 connecting across the scan-in pad Psi and the scan-out pad Pso is decided by the execution of this selection process. The skew across the scan-in pad Psi and FF11 connected to the scan-in pad Psi is taken to be 0. The skew across the scan-out pad Pso and FF44 connected to the scan-out pad Pso is also taken to be 0. If the path selected in the above step is connected using wiring, each of FF11 to FF55 are connected in series in an order shown by arrows in FIG. 2 so as to give a shift register. Data is then supplied from the scan-in pad Psi to FF11 constituting the first stage of the shift register and data is outputted from FF55 constituting the final stage to the scan-out pad Pso.

Next, step ST16 is executed. In step ST16, standard cells or other modules are actually connected by wiring. The path selected in step ST11 to step ST16 is then actually connected by wiring and a scan path network is formed.

Figure 3:
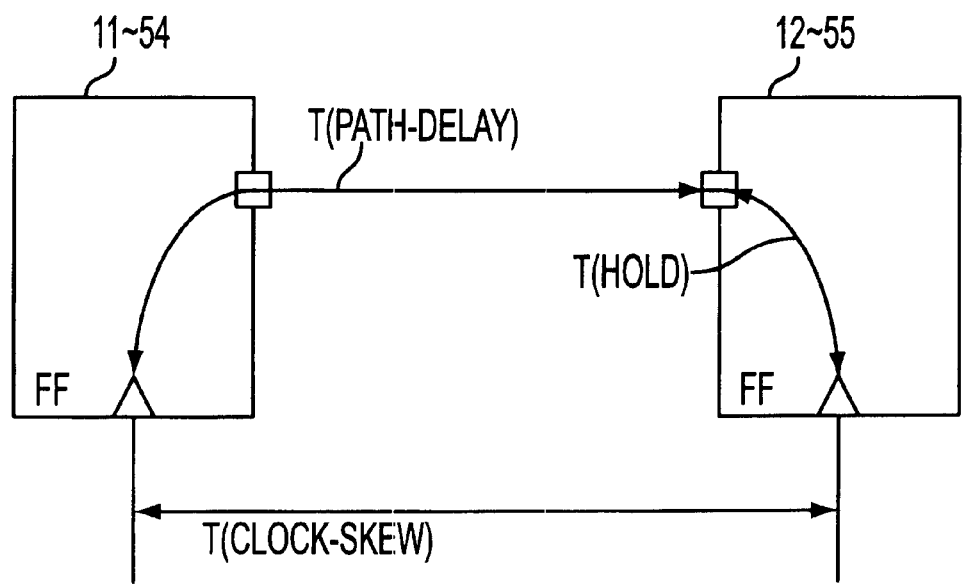
FIG. 3 is a view illustrating hold time errors.

The scan path of the first embodiment is not necessarily short. For example, the output of FF15 is connected to FF35 without being connected to FF24, and the output of FF15 is connected to FF35 without being connected to FF24. However, in step ST15 in the first embodiment, the scan path is decided while also considering the clock skew Smn as well as the distance Lmn so that hold time errors therefore do not occur. A simple description will now be given using FIG. 3 as to why hold time errors do not occur.

Hold time errors generally occur when the following equation (4) is fulfilled.

$$T(\text{path-delay}) < T(\text{hold}) + T(\text{clock skew}) \quad (4)$$

T (path-delay); delay time of signal transmitted through the scan path
T (hold); hold time at FF
T (clock-skew); skew of clock CK at FF As shown in equation (4), hold time errors occur when path delay time T (path-delay) is less than the sum of the hold time T (hold) (the time required for FF to latch data) occurring at each of FF11 to FF55 and the skew T (clock skew). As shown in FIG. 2, gates etc. are not inserted between FFs on the scan path. Therefore, as the path delay T (path-delay) during test mode is small, hold time errors occur easily. For example, in FIG. 2, a scan path on the order of group 10→group 20→group 30 is taken to be formed. As the clock path delay time of group 30 is then greater than the clock path delay time of group 20, equation (4) is fulfilled, and a hold time error occurs.

In the first embodiment, the scan path is connected in order from groups of a large clock delay time Ti to groups of a small clock delay time, and it therefore becomes difficult for hold time errors to occur.

Figure 4:
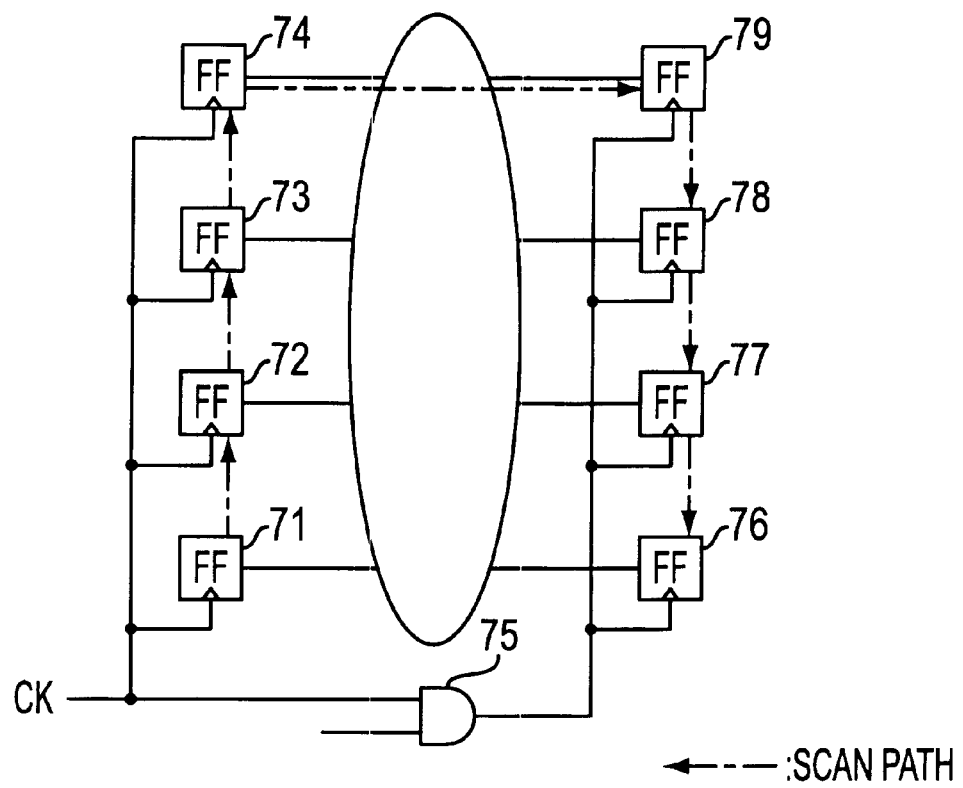
FIG. 4 is a view showing a scan path network to which the first embodiment of the present invention is applied.

FIG. 4 is a further example of a scan path network formed using the method of FIG. 1.

In this example, the scan path network forming method of FIG. 1 and a semiconductor integrated circuit device having this scan path network are applied to an integrated circuit having FF71 to FF74 for directly inputting a clock CK and FF76 to FF79 for inputting the clock CK via an AND gate 75. In the case where the constants K1 to K4 of equation (3) are selected in such a manner as to give priority to keeping the likelihood of the occurrence of a hold time error low rather than to making the scan path short, as shown in FIG. 4, a group of FF71 to FF74 for which clock path delay is approximately equal is first selected, and a group FF76 to FF79 for which clock path delay is approximately equal is then selected, with both groups finally being connected.

As described above, in step ST15 of this first embodiment, the scan path is selected taking not only the distance Lmn but also the clock skew Smn into consideration, and the likelihood of the occurrence of hold time errors can therefore be reduced. Further, in the first embodiment, the weighting given to the length of the scan path network and the clock skew can be changed by changing the constants K1 to K4. For example, if the constants K1 and K2 are made large and the constants K3 and K4 are made small, a scan path can be formed that gives priority to lowering the amount of wiring. Alternatively, when the constants K1 and K2 are made small and the constants K3 and K4 are made large, a scan path network can be formed that gives priority to lowering the likelihood of the occurrence of hold time errors. As a result of this, the time for developing integrated circuits can then be shortened.

Second embodiment

Figure 5:
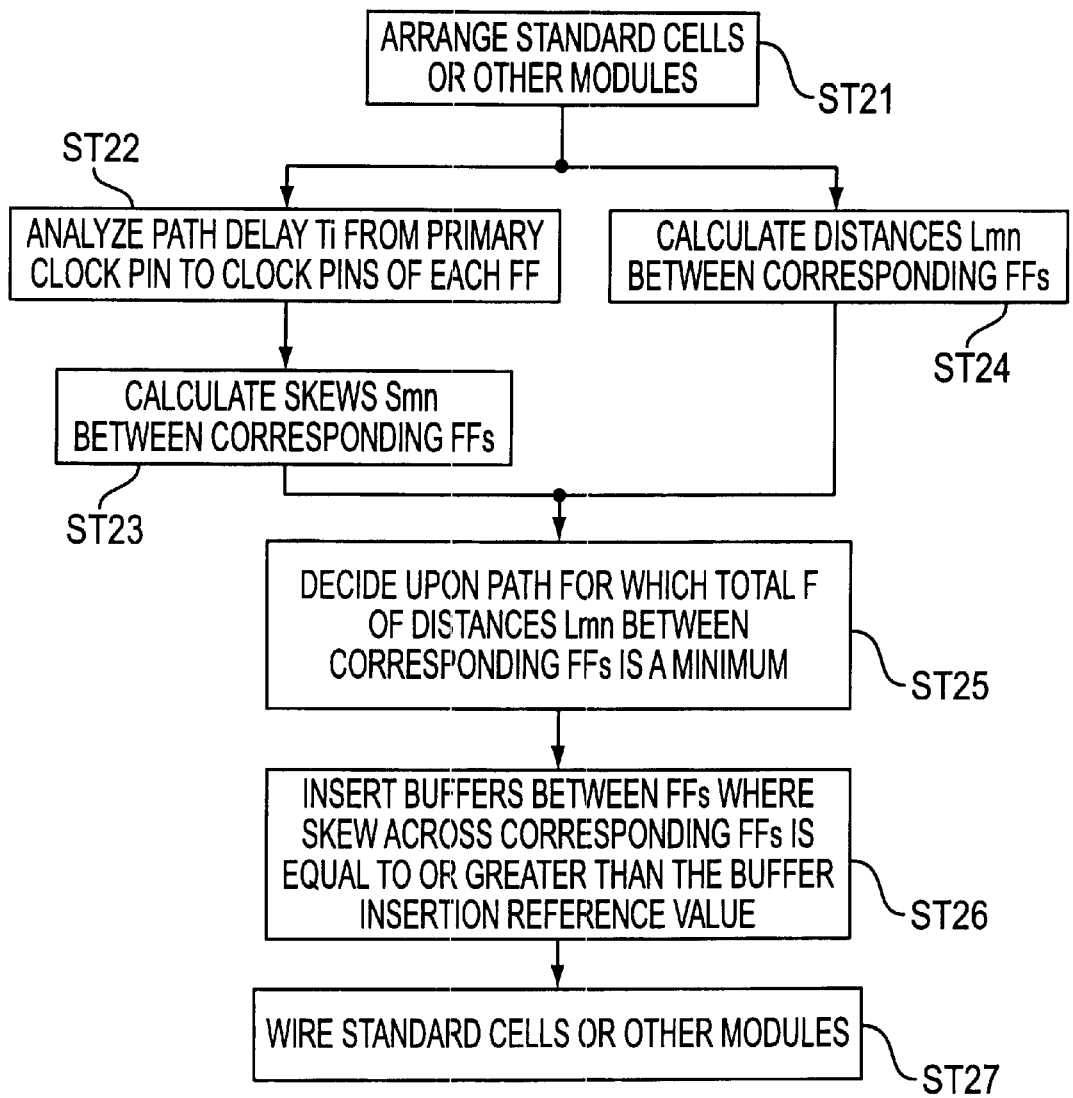
FIG. 5 is a flowchart showing a second embodiment of the present invention.
Figure 6:
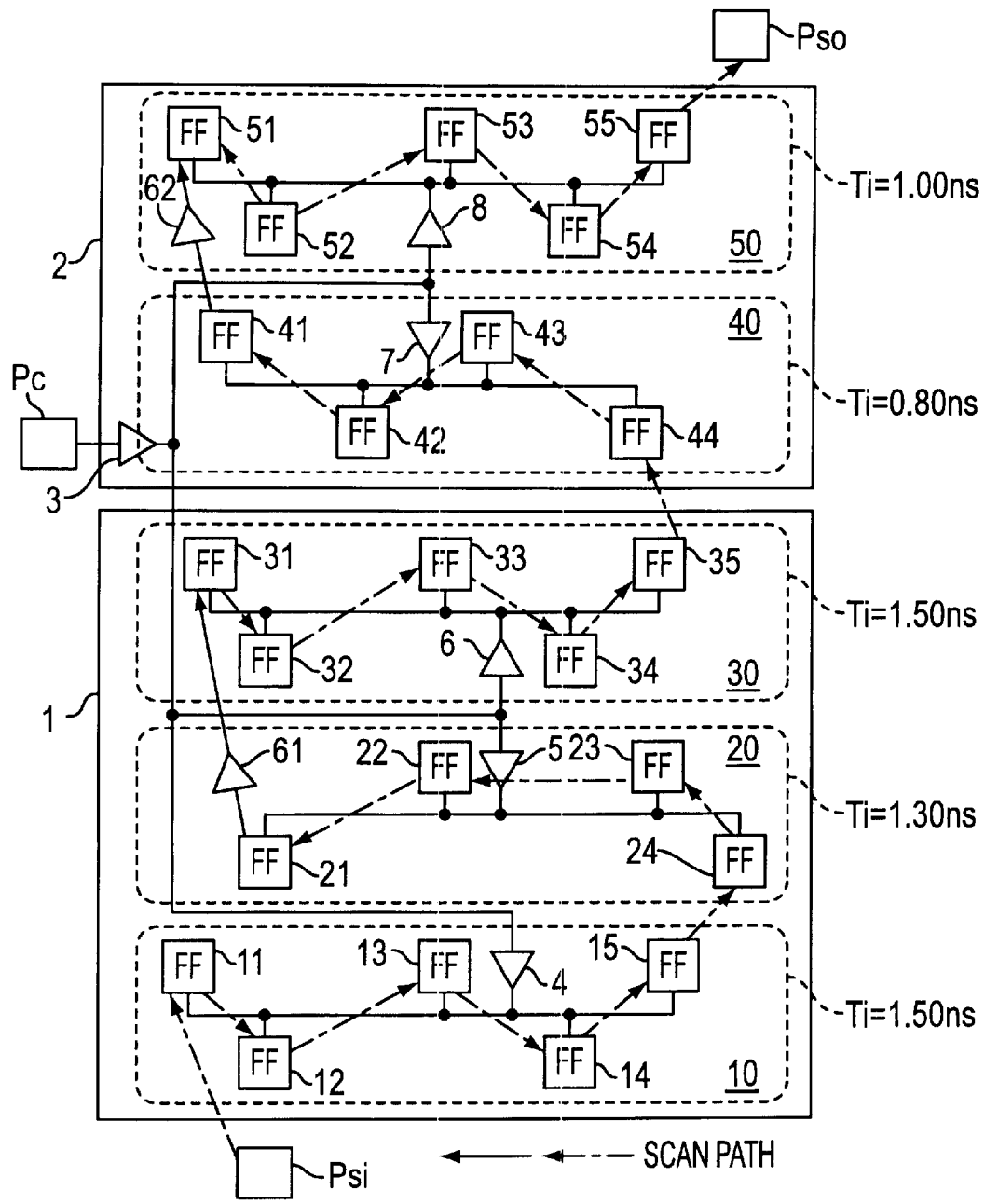
FIG. 6 is a view showing a scan path network to which the second embodiment of the present invention is applied.

FIG. 5 is a flowchart showing a second embodiment of the present invention. FIG. 6 is an example of a scan path network formed using the second embodiment.

Figure 8:
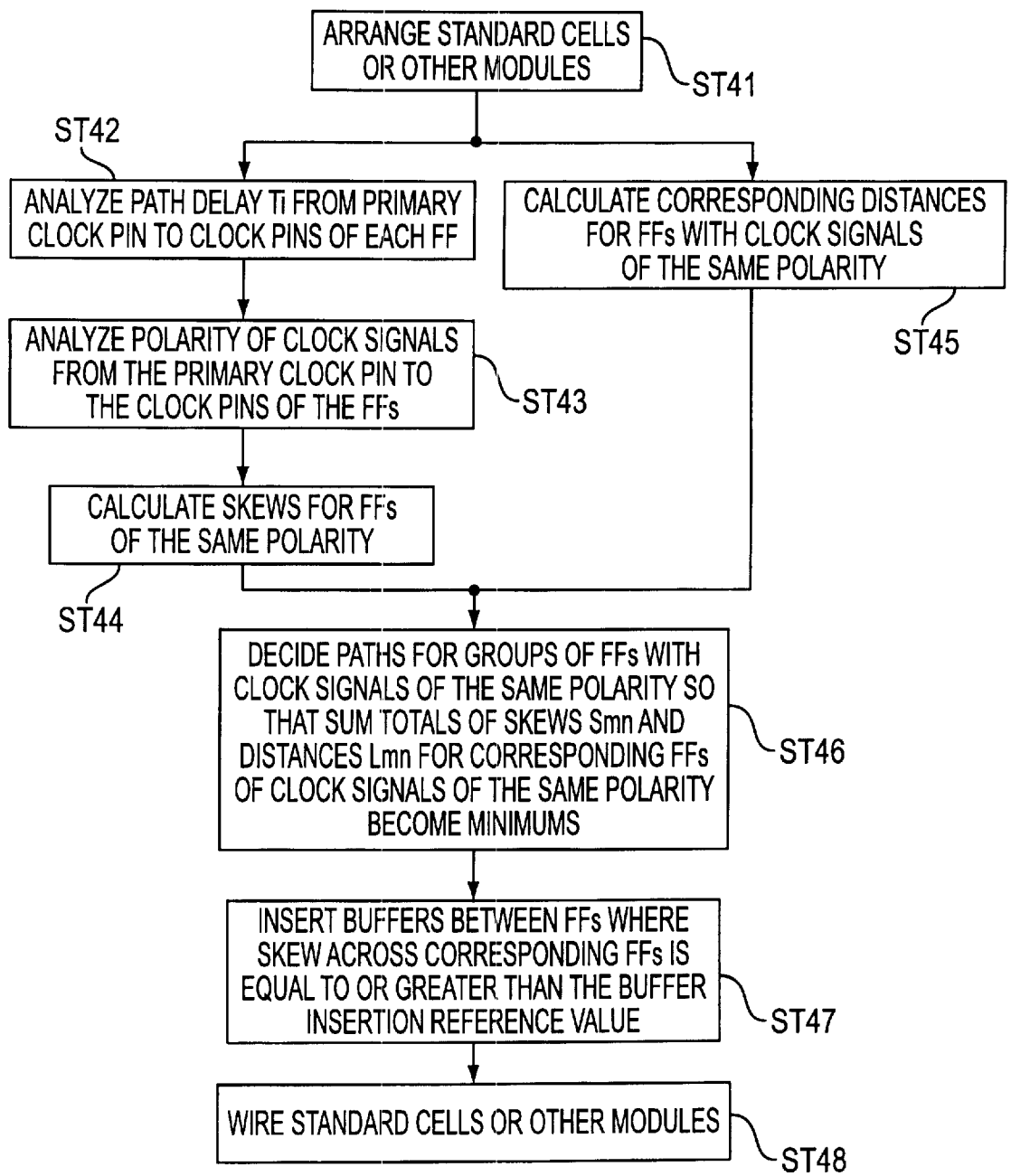
FIG. 8 is a flowchart showing a fourth embodiment of the present invention.

In the second embodiment, step ST21 to step ST27 shown in FIG. 8 are executed. FFs within the LSI are then connected in series so as to form a scan path network by executing step ST21 to step ST27.

The following is a description of step ST21 to step ST24.

Step ST21 to step ST23 are the same as step ST11 to step ST14 of the first embodiment. Namely, a layout process is carried out in step ST21, a clock path delay calculation process is carried out for each FF in step ST22, a skew estimate process is carried out in step ST23, and a distance calculation process is carried out in step ST24.

Step ST25 and step ST26 for after step ST21 to step ST24 are complete are a characteristic of the second embodiment.

Step ST25 is a path selection process differing from that of the first embodiment. In this path selection process, a path (scan path) from the scan-in pad Psi to the scan-out pad Pso is selected in such a manner that the sum total F of the distances Lmn between FFs is a minimum. This selection process is calculated using the following equation (5).

$$F = \sum_{mn} Lmn \quad (5)$$

Step ST26 is a buffer insertion process. In this insertion process, determinations are made as to whether or not the skews Smn across FFs obtained in step ST23 are greater than or equal to a buffer insertion reference value. When the skews Smn are equal to or larger than the buffer insertion reference value, a buffer constituting a delay means is inserted between FFs.

As shown, for example, in FIG. 6, in the path selection process, the scan path is selected in the order of group 10→group 20→group 30→group 40→group 50. Within the scan path, there is a possibility of a hold time error occurring between group 20 and group 30, and between group 40 and group 50, i.e. connection is in an order from groups of a small clock delay time Ti to groups of a large clock delay time Ti. Specifically, the delay time of the clock path for the group 30 is larger than the delay time for the clock path of the group 20, and the delay time of group 50 is larger than the clock path delay time of the group 40. In this buffer insertion process, it is determined that the skews Smn are equal to or larger than the buffer insertion reference value between group and group 30, and between group 40 and group 50. Accordingly, a buffer 61 constituting a delay means is then inserted between FF21 and FF31, and a buffer 41 constituting a delay means is inserted between FF41 and FF51 based on the results of this determination.

If the path selected in the above step is connected by wiring, FF11 to FF55 are connected in series in the order shown by the arrows of FIG. 6 so as to form a shift register. Data is then supplied from the scan-in pad Psi to FF11 constituting the first stage of the shift register and data is outputted from FF55 constituting the final stage to the scan-out pad Pso.

Next, step ST27 is executed. In step ST27 standard cells or other modules are actually connected using wiring. Further, the path selected in step ST21 to step ST27 is actually connected using wiring so as to form a scan path network.

According to the second embodiment, as buffers are automatically inserted a places having a skew Smn exceeding the buffer insertion reference value, the likelihood of a hold time error occurring is reduced. Further, as the buffer insertion reference value can be designated by a user, adjustments can be made to give lowering of layout surface area priority or to give lowering of the likelihood of occurrence of hold time errors priority. For example, if the buffer insertion reference value is made small, the number of buffers inserted is reduced and a scan path network where priority is given to lowering the layout surface area is formed as a result. Further, if the buffer insertion reference value is made high, a scan path network giving priority to lowering of the likelihood of the occurrence of hold time errors is formed and the period for developing integrated circuits is shortened as a result.

Third Embodiment

Figure 7:
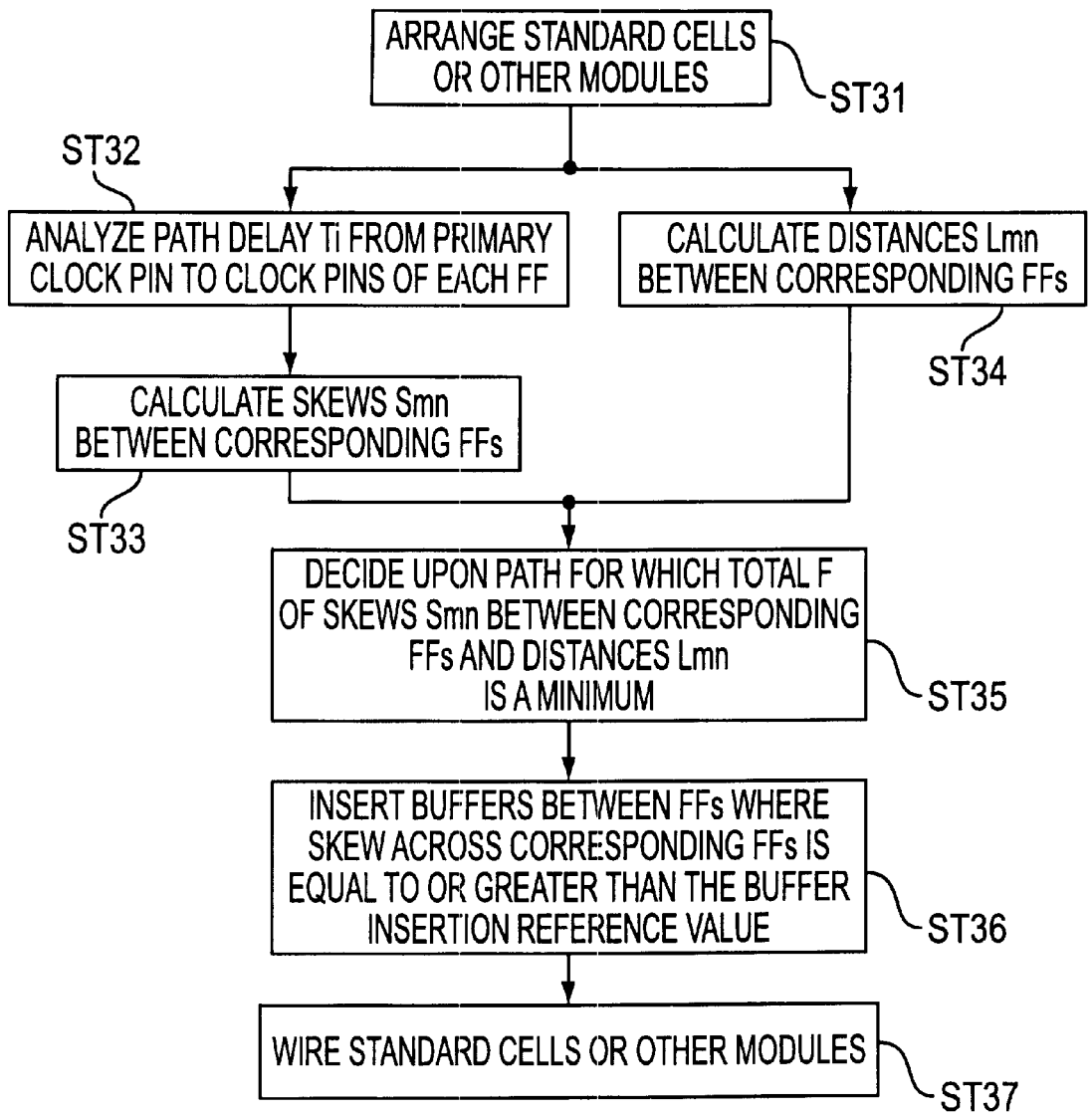
FIG. 7 is a flowchart showing a third embodiment of the present invention.

FIG. 7 is a flowchart showing a third embodiment of the present invention.

In this third embodiment, step ST31 to step ST37 shown in FIG. 7 are executed. FFs within the LSI are then connected in series so as to form a scan path network by executing step ST31 to step ST37.

The following is a description of step ST31 to step ST37.

Step ST31 to step ST35 are the same as step ST11 to step ST15 of the first embodiment. Namely, a layout process is carried out in step ST31, a clock path delay calculation process is carried out for each FF in step ST32, a skew estimate process is carried out in step ST33, a distance calculation process is carried out in step ST34 and a path selection process is carried out in step ST35.

Step ST36 following step ST31 to step ST35 is the same process as for the insertion process for step ST26 of the second embodiment.

Next, step ST37 is executed. In step ST37 the standard cells and other modules are actually connected by wiring. The path selected in step ST31 to step ST37 is then actually connected by wiring so as to form a scan path network.

In the third embodiment, as step ST35 that is the same as step ST15 of the first embodiment is carried out, a scan path network can be formed where the length of the wiring and the skew for the scan path network can be made a minimum simultaneously. In addition, in this third embodiment, as the step ST36 that is the same as step ST26 of the second embodiment is executed, the likelihood of the occurrence of a hold time error can be reduced in a reliable manner and the development period for integrated circuits can be made shorter.

Fourth Embodiment

Figure 9:
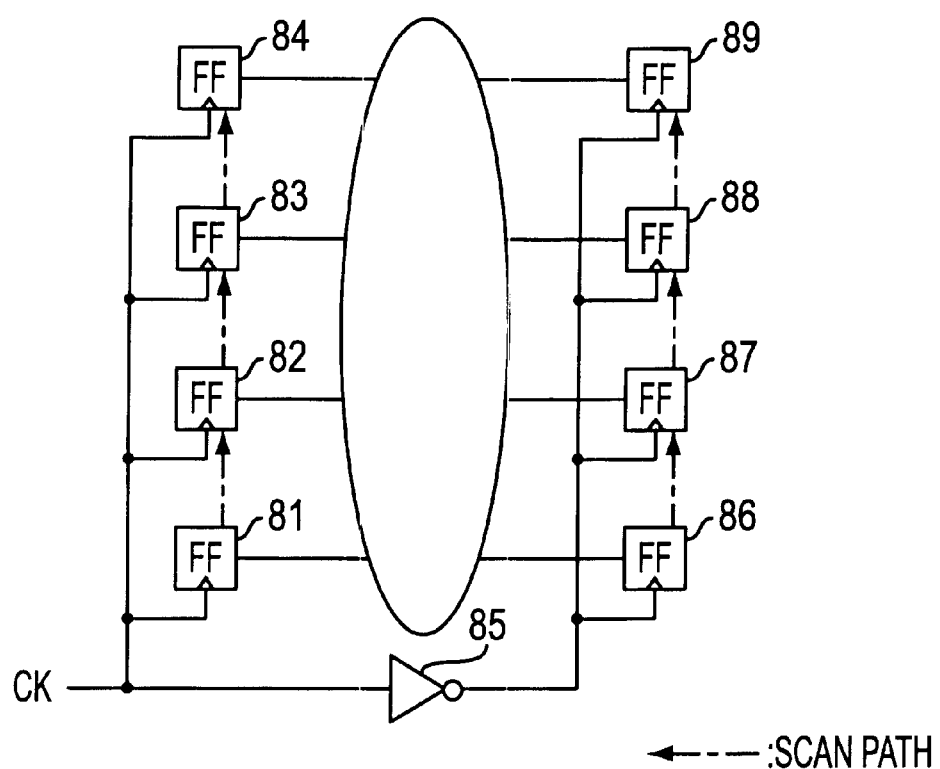
FIG. 9 is a view showing a scan path network to which the fourth embodiment of the present invention is applied.

FIG. 8 is a flowchart showing a fourth embodiment of the present invention. FIG. 9 is an example of a scan path network formed using the fourth embodiment.

Here, there are first type FFs in synchronization with the falling edge (negative edge) of the clock CK and second type FFs in synchronization with the rising edge (positive edge) of the clock CK. Some semiconductor circuits have both first type and second type FFs. In such a case, one scan path network can be formed using groups comprising pluralities of first type FFs and a further scan path network can be formed using groups comprising a plurality of second type FFs.

Step ST41 to step ST47 of FIG. 8 are executed in this fourth embodiment. Namely, a scan path network comprising FF groups having FFs synchronized with the falling edge of the clock CK and a scan path network comprising FF groups having FFs synchronized with the rising edge of the clock CK are formed. Specifically, the integrated circuit is assumed to have FF81 to FF84 for scan use for latching data in synchronization with the rising edge of the clock CK and FF86 to FF89 for scan use for latching data in synchronization with the falling edge of the clock CK. An inverter 85 for inverting the clock CK is connected between FF81 to FF84 for scan use and FF86 to FF89 for scan use. In the above integrated circuit, the following steps are executed when a scan path network is formed using FF81 to FF84 and FF86 to FF89.

First, step ST41 and step ST42 are executed. Step ST41 is a layout process that is the same as step ST11 of the first embodiment. Step ST42 is a clock delay calculation process that is the same as step ST12.

Next, in step ST43, determinations are made based on circuit information as to whether or not FF81 to FF84 and FF86 to FF89 are FFs taking in data in synchronization with the falling edge of the clock CK or FFs taking in data in synchronization with the rising edge of the clock CK.

Next, in step ST44, skew values for the clocks for FF81 to FF84 and skew values for the clocks for FF86 to FF89 are calculated. The method for calculating the skew values in this embodiment is the same as that of step ST13 of the first embodiment, although in this fourth embodiment the calculation for the group of FF81 to FF84 and the calculation for the group of FF86 to FF89 are carried out independently.

Step ST45 is executed in parallel with step ST42 to step ST44. Step ST45 is a distance calculating process that is the same as step ST14 of the first embodiment.

Next, step ST46 is executed. Step ST46 is a path selection process that is the same as step ST15 of the first embodiment. A point that distinguishes the fourth embodiment from the first embodiment is that selection with respect to the group of FF81 to FF84 and selection with respect to the group of FF86 to FF89 is carried out independently.

Next, step ST47 is executed. Step ST47 is a buffer insertion process that is the same as step ST26 of the second embodiment.

Finally, step ST48 is executed. Step ST48 is a process that is the same as step ST16 of the first embodiment. A scan path comprising FF81 to FF84 and a scan path comprising FF86 to FF89 are then formed by executing the above steps.

In the fourth embodiment, step ST43 is executed to determine FFs taking in data in synchronization with the falling edge of the clock CK and FFs taking in data in synchronization with the rising edge of the clock CK. A scan path network having the same benefits as the third embodiment can therefore be formed even for integrated circuits that includes both FFs operating on the falling edge of the clock CK and FFs operating on the rising edge of the clock CK and the development period for integrated circuits can therefore be made smaller.

The present invention is by no means limited to the above embodiments and various modifications are possible. Examples of such modifications are as follows.

(1) The first to fourth embodiments use the Manhattan distance Lmn of equation (2) but it is also possible to use other methods of calculation employing coordinate values for FFm and FFn in accordance with a program to which scan path networks are applied.

(2) In the first to third embodiments, a description has been given using Xm, Xn, Ym and Yn to indicate the center of the coordinates for FFm and FFn, but it is also possible to replace the coordinates for FFm with the coordinates of the pad Psi and replace the coordinates for FFn with the coordinates for the pad Pso in the case where FFm is a start point and FFn is an end point.

(3) In the first, third and fourth embodiments, equation (3) is used to calculate the sum total F of the skew values Smn and the distances Lmn, but this sum total can also be obtained using other calculating methods.

(4) The buffer insertion reference value of the second embodiment may be a fixed value or may be an arbitrary parameter decided in response to the scale of the circuit.

(5) The calculation of the distance Lmn of the first to fourth embodiments can also be executed prior to step ST12, step ST22, step ST32 or step ST42.

(6) Step ST43 of the fourth embodiment can also be executed prior to step ST42.

(7) A buffer was used as delay means in the second to fourth embodiments but other gate circuits are also possible.

(8) An example of forming a single scan path network at a semiconductor chip is given in the first to third embodiments but it is also possible to form a plurality of scan path networks.

(9) In the first to fourth embodiments a scan path network is formed using FFs operating on the same clock CK. However, the scan path network forming method of the present invention can be applied even to pluralities of FF groups having differing frequencies by using the kind of AND gates shown in FIG. 4.

(10) In the first to third embodiments all of the FFs operate on the rising edge or falling edge of the clock CK but independent scan paths can also be formed by dividing between both FFs operating on rising edges and falling edges in the same way as in the fourth embodiment.

(11) A semiconductor chip is assumed in the first to fourth embodiments but the same techniques can also be applied to a megacell.

(12) A scan path network is formed using only FFs for scan use in the first to fourth embodiments but the same techniques can also be applied to the case of incorporating a scan path network onto an already designed megacell.

(13) FFs within a usual logic circuit have been taken as the processing target in the first to fourth embodiments, but a register for boundary scan use can also be taken as the processing target.

(14) FFs within a usual logic circuit have been taken as the processing target in the first to fourth embodiments but a shift register itself can be taken as the processing target when this shift register is implemented as a soft macro comprising FFs.

What is claimed is:

1. A method of forming a scan path network at a semiconductor integrated circuit having a clock node supplied with a clock signal, a scan-in node supplied with scan data and a scan-out node for receiving scan data outputted from scan flip-flops, said method comprising the steps of:

(a) arranging a plurality of scan flip-flops, (b) calculating delay times for said clock signal supplied to said clock node to reach said scan flip-flops, (c) calculating distances between said scan flip-flops, (d) calculating skews between said scan flip-flops, (e) calculating a sum of said calculated distances and said skews, (f) deciding upon the smallest value of calculation results of said step (e), and (g) connecting said scan flip-flops between said scan-in node and said scan-out node based on the value obtained in said step (f).

2. The method of claim 1, wherein said step (b) and said step (c) are executed in parallel.

3. The method of claim 1, wherein said step (b) defines a plurality of groups comprised of pluralities of scan flip-flops having substantially equal delay times.

4. The method of claim 3, wherein a logic circuit is connected across said clock node and one of said groups.

5. The method of claim 4, wherein said logic circuit is an AND gate.

6. The method of claim 4, wherein a period of a clock signal supplied to one of said groups of flip-flops and a period of a clock signal supplied to a further group of said groups of flip-flops are different.

7. The method of claim 1, further comprising the steps of:

after said step (f), calculating whether or not skews between said flip-flops exceed a reference value, and inserting delay means between said flip-flops having skews exceeding said reference value.

8. The method of claim 7, wherein said delay means is a buffer.

9. A method of forming a scan path network at a semiconductor integrated circuit having a clock node supplied with a clock signal, a scan-in node supplied with scan data and a scan-out node for receiving scan data outputted from scan flip-flops, said method comprising the steps of:

(a) arranging a plurality of scan flip-flops, (b) calculating delay times for said clock signal supplied to said clock node to reach said scan flip-flops, (c) calculating distances between said scan flip-flops, (d) calculating skews between said scan flip-flops, (e) calculating a sum of said calculated distances, (f) deciding upon the smallest value of calculation results of said step (c), (g) calculating whether or not skews between said flip-flops exceed a reference value, (h) inserting delay means between said flip-flops having skews exceeding said reference value, and (i) connecting said scan flip-flops between said scan-in node and said scan-out node based on the value obtained in said step (f).

10. The method of claim 9, wherein said delay means is a buffer.

11. The method of claim 9, wherein said step (b) and said step (c) are executed in parallel.

12. The method of claim 9, wherein said step (b) defines a plurality of groups comprised of pluralities of scan flip-flops having substantially equal delay times.

13. The method of claim 12, wherein a logic circuit is connected across said clock node and one of said groups.

14. The method of claim 13, wherein said logic circuit is an AND gate.

15. The method of claim 13, wherein a period of a clock signal supplied to one group of said groups of flip-flops and a period of a clock signal supplied to a further group of said groups of flip-flops are different.

16. A method of forming a scan path network at a semiconductor integrated circuit having a clock node supplied with a clock signal, a scan-in node supplied with scan data and a scan-out node for receiving scan data outputted from scan flip-flops, said method comprising the steps of:

(a) arranging a plurality of first scan flip-flops operating in synchronization with a rising edge of said clock signal and a plurality of second scan flip-flops operating in synchronization with a falling edge of said clock signal, (b) calculating delay times for said clock signal supplied to said clock node to reach said scan flip-flops, (c) calculating distances between said first scan flip-flops and calculating distances between said second scan flip-flops, (d) calculating skew between said first scan flip-flops and calculating skew between said second scan flip-flops, (e) calculating a total of said distances and said skews relating to said first scan flip-flops and calculating a total of said distances and said skews relating to said second scan flip-flops, (f) deciding upon a minimum value relating to said first scan flip-flops and deciding upon a minimum value relating to said second scan flip-flops from calculation results of said step (e), and (g) connecting said scan flip-flops between said scan-in node and said scan-out node based on the value obtained in said step (f).

17. The method of claim 16, wherein said step (b) and said step (c) are executed in parallel.

18. The method of claim 16, wherein a logic circuit is connected actors said clock node and one of said groups.

19. The method of claim 18, wherein said logic circuit is an AND gate.

20. The method of claim 18, wherein a period of a clock signal supplied to said first scan flip-flops and a period of a clock signal supplied to said second scan flip-flops are different.

21. The method of claim 16, further comprising the steps of:

after said step (f), calculating whether or not skews between said flip-flops exceed a reference value, and inserting delay means between said flip-flops having skews exceeding said reference value.

22. The method of claim 21, wherein said delay means is a buffer.

\* \* \* \* \*